(12) United States Patent
Lee et al.

(10) Patent No.: US 12,429,973 B2
(45) Date of Patent: Sep. 30, 2025

(54) INPUT SENSING UNIT WITH PARTIALLY OVERLAPPING LINES IN A PERIPHERAL AREA AND ELECTRONIC DEVICE INCLUDING THE SAME

(71) Applicant: Samsung Display Co., Ltd., Yongin-Si (KR)

(72) Inventors: Eungkwan Lee, Suwon-si (KR); Taejoon Kim, Seongnam-si (KR); Hyun-wook Cho, Seongnam-si (KR); Jaewoo Choi, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 16/519,006

(22) Filed: Jul. 23, 2019

(65) Prior Publication Data

US 2020/0110498 A1    Apr. 9, 2020

(30) Foreign Application Priority Data

Oct. 5, 2018  (KR) .......................... 10-2018-0118736

(51) Int. Cl.
*G06F 3/041*      (2006.01)
*G06F 3/044*      (2006.01)
(Continued)

(52) U.S. Cl.
CPC ........ *G06F 3/04164* (2019.05); *G06F 3/0412* (2013.01); *G06F 3/0446* (2019.05);
(Continued)

(58) Field of Classification Search
CPC ................. G06F 3/0412; G06F 3/0446; G06F 2203/04111; G06F 3/044; G06F 3/0443; H01L 27/323; H01L 27/3244
See application file for complete search history.

(56) References Cited

U.S. PATENT DOCUMENTS 11,489,025 B2    11/2022  Kim et al.
2011/0261009 A1*  10/2011  Inagaki .................. G06F 3/044
                                                     345/174
(Continued)

FOREIGN PATENT DOCUMENTS

CN        107491222 A    12/2017
CN        107665062 A    2/2018
(Continued)

*Primary Examiner* — Benjamin C Lee
*Assistant Examiner* — Nathan P Brittingham
(74) *Attorney, Agent, or Firm* — Innovation Counsel LLP

(57) ABSTRACT

An electronic device according to an embodiment of the inventive concept includes a display panel divided into a display area on which the pixels are disposed and a non-display area disposed adjacent to the display area on a plane, and an input sensing unit including a first pattern and a second pattern, which are disposed on the display panel, overlap the display area, and disposed on the same layer while being spaced apart from each other, an insulation layer disposed on the encapsulation layer, and a first line and a second line, which overlap the non-display area and are disposed on different layers from each other with the insulation layer therebetween, wherein the first line is connected to the first pattern and the second line is connected to the second pattern. The first line overlaps at least a portion of the second line on the plane.

18 Claims, 11 Drawing Sheets

(51) Int. Cl.
*H10K 59/12* (2023.01)
*H10K 59/131* (2023.01)
*H10K 59/40* (2023.01)
*H10K 59/80* (2023.01)

(52) U.S. Cl.
CPC .......... *H10K 59/12* (2023.02); *H10K 59/131* (2023.02); *H10K 59/40* (2023.02); *H10K 59/87* (2023.02); *H10K 59/873* (2023.02); *G06F 2203/04111* (2013.01)

(56) References Cited

U.S. PATENT DOCUMENTS

| | | | | |
|---|---|---|---|---|
| 2011/0316803 A1* | 12/2011 | Kim | ........................ | G06F 3/044 345/173 |
| 2012/0097514 A1* | 4/2012 | Ku | ........................ | G06F 3/0443 200/512 |
| 2016/0179268 A1 | 6/2016 | Hong | | |
| 2017/0364194 A1 | 12/2017 | Jang et al. | | |
| 2018/0032197 A1* | 2/2018 | Jin | ........................ | G02F 1/1343 |
| 2018/0059862 A1* | 3/2018 | Zeng | ........................ | G06F 3/0446 |
| 2018/0061898 A1* | 3/2018 | Oh | ........................ | G06F 3/0446 |
| 2018/0129330 A1* | 5/2018 | Ding | ........................ | G06F 3/0412 |
| 2018/0130863 A1 | 5/2018 | Yamazaki et al. | | |
| 2018/0314361 A1* | 11/2018 | Chen | ........................ | G06F 3/0446 |
| 2019/0073052 A1* | 3/2019 | Chen | ........................ | G06F 1/1692 |
| 2019/0129552 A1* | 5/2019 | Lee | ........................ | G06F 3/0412 |

FOREIGN PATENT DOCUMENTS

| | | |
|---|---|---|
| CN | 107799549 A | 3/2018 |
| KR | 10-2013-0047018 A | 5/2013 |
| KR | 10-2016-0074805 A | 6/2016 |
| KR | 10-2017-0142243 A | 12/2017 |
| TW | 1635424 B | 9/2018 |

\* cited by examiner

INPUT SENSING UNIT WITH PARTIALLY OVERLAPPING LINES IN A PERIPHERAL AREA AND ELECTRONIC DEVICE INCLUDING THE SAME

CROSS-REFERENCE TO RELATED APPLICATIONS

This U.S. non-provisional patent application claims priority under 35 U.S.C. § 119 of Korean Patent Application No. 10-2018-0118736, filed on Oct. 5, 2018, the entire contents of which are hereby incorporated by reference.

BACKGROUND

The present disclosure relates to an input sensing unit and an electronic device including the input sensing unit, and more particularly, to an input sensing unit having a reduced non-active area and an electronic device including the input sensing unit.

An electronic device may be activated by receiving an electric signal. The electronic device may include an electronic panel that detects various types of inputs applied from the outside, e.g., a touch from a user. The electronic panel may be singly used or may further include a display unit for displaying an image to enhance user convenience.

The electronic device may include various electrode patterns so as to be activated by an electric signal. An area in which the electrode patterns are activated displays information or reacts to a touch applied from the outside.

SUMMARY

The present disclosure provides an input sensing unit having a structure for reducing a non-active area at which an image and an input are not detectable and an electronic device including the same.

An embodiment of the inventive concept provides an electronic device including: a display panel including a base layer, a pixel layer disposed on the base layer and including a plurality of pixels, and an encapsulation layer covering the pixel layer, the display panel being divided into a display area on which the pixels are disposed and a non-display area disposed adjacent to the display area on a plane; and an input sensing unit including a first pattern and a second pattern which are disposed on the display panel, overlap the display area, and disposed on the same layer while being spaced apart from each other, an insulation layer disposed on the encapsulation layer, and a first line and a second line which overlap the non-display area and are disposed on different layers from each other with the insulation layer therebetween, wherein the first line is connected to the first pattern and the second line is connected to the second pattern. Here, the first line overlaps at least a portion of the second line on the plane.

In an embodiment, one of connection between the first pattern and the first line and connection between the second pattern and the second line may be connected through a contact hole passing through the insulation layer, and the other thereof may be directly connected on the same layer.

In an embodiment, the first pattern and the first line may be directly connected on the same layer, and at least a portion of the first line may cover at least a portion of the pattern.

In an embodiment, the first pattern and the first line may be directly connected on the same layer, and the first pattern and the first line may have an integrated shape.

In an embodiment, the electronic device may further include: a third pattern disposed on the same layer as the first pattern and spaced apart from the first pattern and the second pattern; and a third line connected to the third pattern.

In an embodiment, the third pattern may be spaced apart from the first pattern with the second pattern therebetween, and the third line may be disposed on the same layer as one of the first line and the second line.

In an embodiment, the third pattern may be disposed between the first pattern and the second pattern, and the third line may be disposed on the same layer as one of the first line and the second line.

In an embodiment, the encapsulation layer may include an organic layer and a plurality of inorganic layers covering the organic layer.

In an embodiment, the electronic device may further include a sealing part disposed to overlap the non-display area, and the sealing part may be disposed between the base layer and the encapsulation layer.

In an embodiment of the inventive concept, an electronic device includes: a display panel including a base layer, a pixel layer disposed on the base layer and including a plurality of pixels, and an encapsulation layer covering the pixel layer, the display panel being divided into a display area on which the pixels are disposed and a non-display area disposed adjacent to the display area on a plane; and an input sensing unit including a first pattern and a second pattern which are disposed on the display panel, overlap the display area, and disposed on the same layer while being spaced apart from each other, an insulation layer disposed on the encapsulation layer, and a first line and a second line which overlap the non-display area and are disposed on different layers from each other with the insulation layer therebetween, wherein the first line is connected to the first pattern and the second line is connected to the second pattern. Here, connection between the first pattern and the first line is connected through a contact hole passing through the insulation layer, and connection between the second pattern and the second line is directly connected the same layer.

In an embodiment, the first line and the second line may at least partially overlap each other on the plane.

In an embodiment, the electronic device may further include: a third pattern disposed on the same layer as the first pattern, and spaced apart from the first pattern and the second pattern; and a third line connected to the third pattern. Here, the third line may be connected to the third pattern through a contact hole passing through the insulation layer.

In an embodiment, the electronic device may further include: a fourth pattern disposed on the same layer as the third pattern, and spaced apart from the first pattern, the second pattern, and the third pattern; and a fourth line connected to the fourth pattern. Here, the fourth line may be disposed on the same layer as the fourth pattern and directly connected to the fourth pattern, and overlap at least a portion of the third line on a plane.

In an embodiment, the first line and the third line may be spaced apart from each other on the same layer.

In an embodiment, the connection between the second pattern and the second line may be connected such that a portion of the second line covers a portion of the second pattern.

In an embodiment of the inventive concept, an input sensing unit includes: a sensing area configured to detect a touch applied from the outside; a peripheral area disposed adjacent to the sensing area; a first driving electrode and a second driving electrode, which overlap the sensing area and each extend in a first direction while being spaced apart from each other in a second direction crossing the first direction; a first sensing electrode and a second sensing electrode, which overlap the sensing area, are spaced apart from the first driving electrode and the second driving electrode, respectively, and each extend in the second direction while being spaced apart from each other in the first direction; and a first line and a second line, which are disposed on the peripheral area and connected to the first sensing electrode and the second sensing electrode, respectively. Here, the first line and the second line at least partially overlap each other on a plane.

In an embodiment, the first line and the second line may be spaced apart from each other with an insulation layer disposed therebetween.

In an embodiment, the input sensing unit may further include a third line and a fourth line, which are disposed on the peripheral area, and connected to the first driving electrode and the second driving electrode, respectively, and the third line and the fourth line may overlap each other on the plane while being spaced apart from each other with the insulation layer therebetween.

In an embodiment, each of the first driving electrode and the second driving electrode may include driving patterns spaced apart from each other in the first direction and connecting patterns disposed between the driving patterns to connect the driving patterns, and the driving patterns may be connected to the connecting patterns through a contact hole passing through the insulation layer.

In an embodiment, each of the first sensing electrode and the second sensing electrode may include sensing patterns spaced apart from each other in the second direction and connecting patterns disposed between the sensing patterns to connect the sensing patterns, and the connecting patterns may be disposed on the same layer as the driving patterns.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
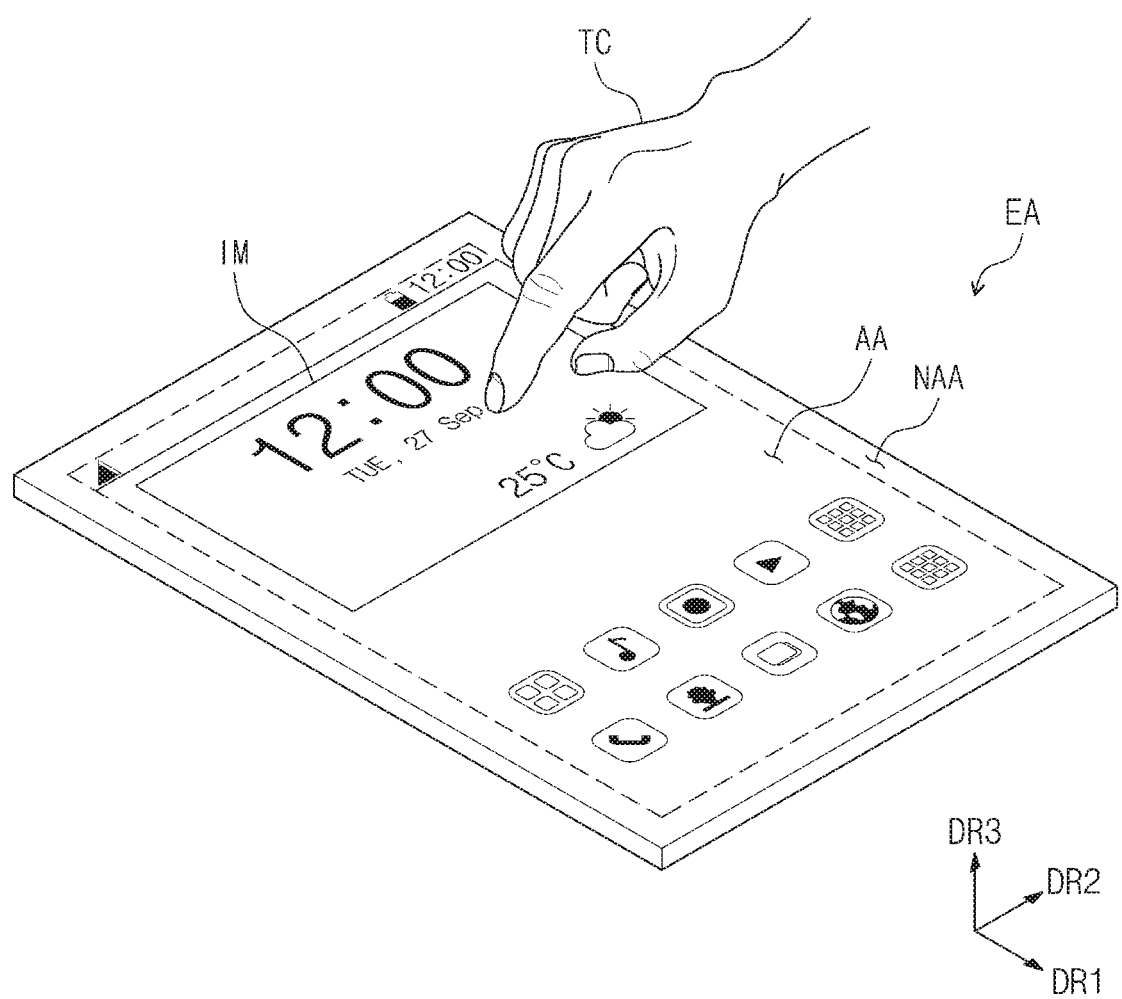
FIG. 1 is a perspective view illustrating an electronic device according to an embodiment of the inventive concept.

In this specification, it will be understood that when an element such as a region, layer, or portion is referred to as being "on" another element, it can be directly on the other element or intervening elements may also be present.

Like reference numerals refer to like elements throughout. Also, in the drawings, the thicknesses, ratios, and dimensions of components are exaggerated for clarity of illustration.

As used herein, the term "and/or" includes any and all combinations of one or more of the associated listed items.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms are relative concepts and described with respect to the direction indicated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a region, a fixed number, a step, a process, an element and/or a component but does not exclude other properties, regions, fixed numbers, steps, processes, elements and/or components. Hereinafter, embodiments of the inventive concept will be described with reference to the accompanying drawings.

Figure 2A:
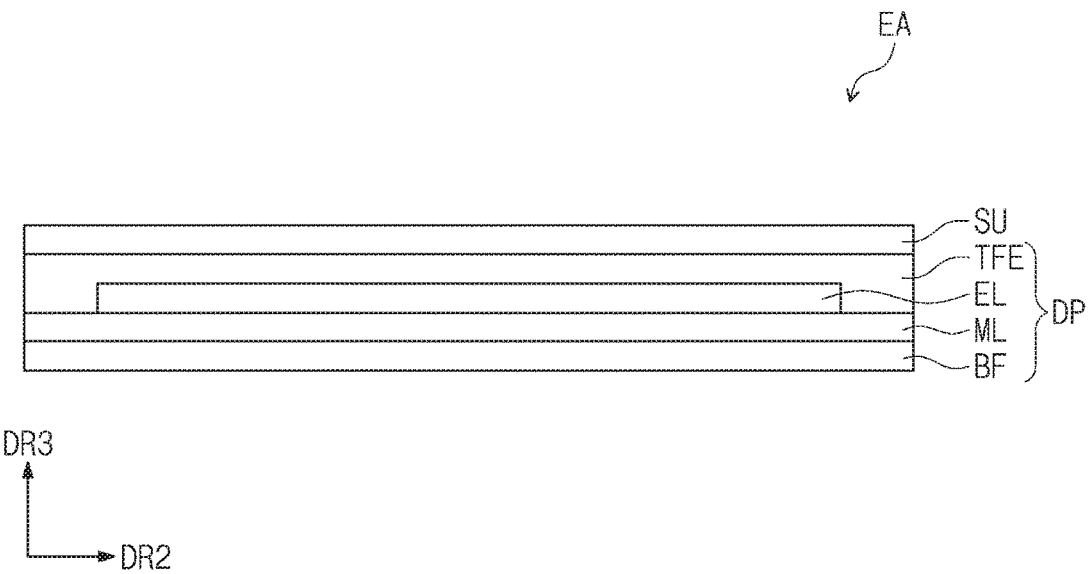
FIGS. 2A to 2B are cross-sectional views illustrating the electronic device according to an embodiment of the inventive concept.
Figure 2B:
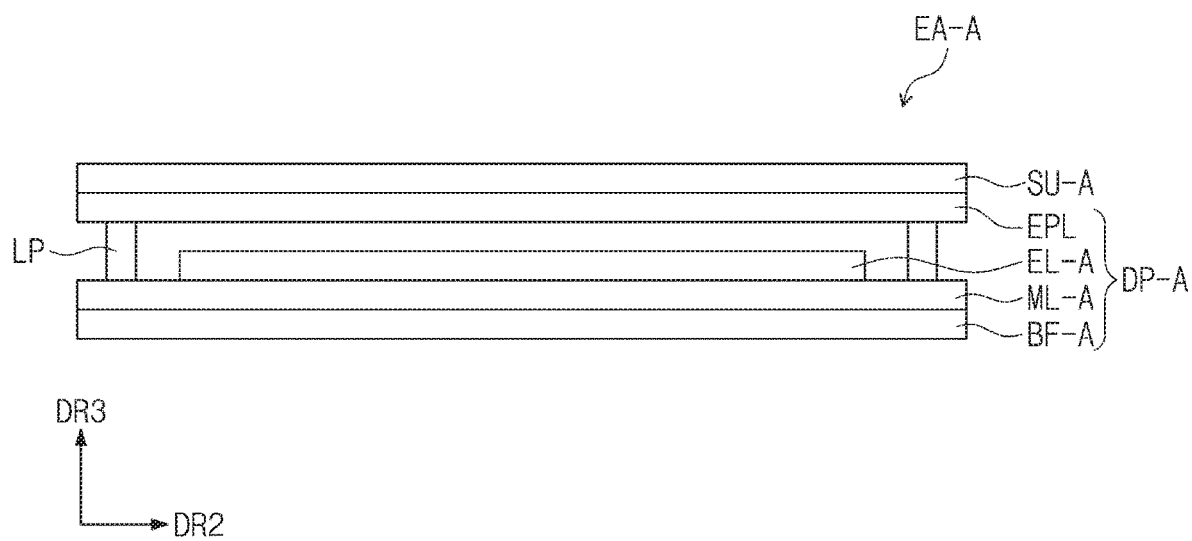
Figure 3:
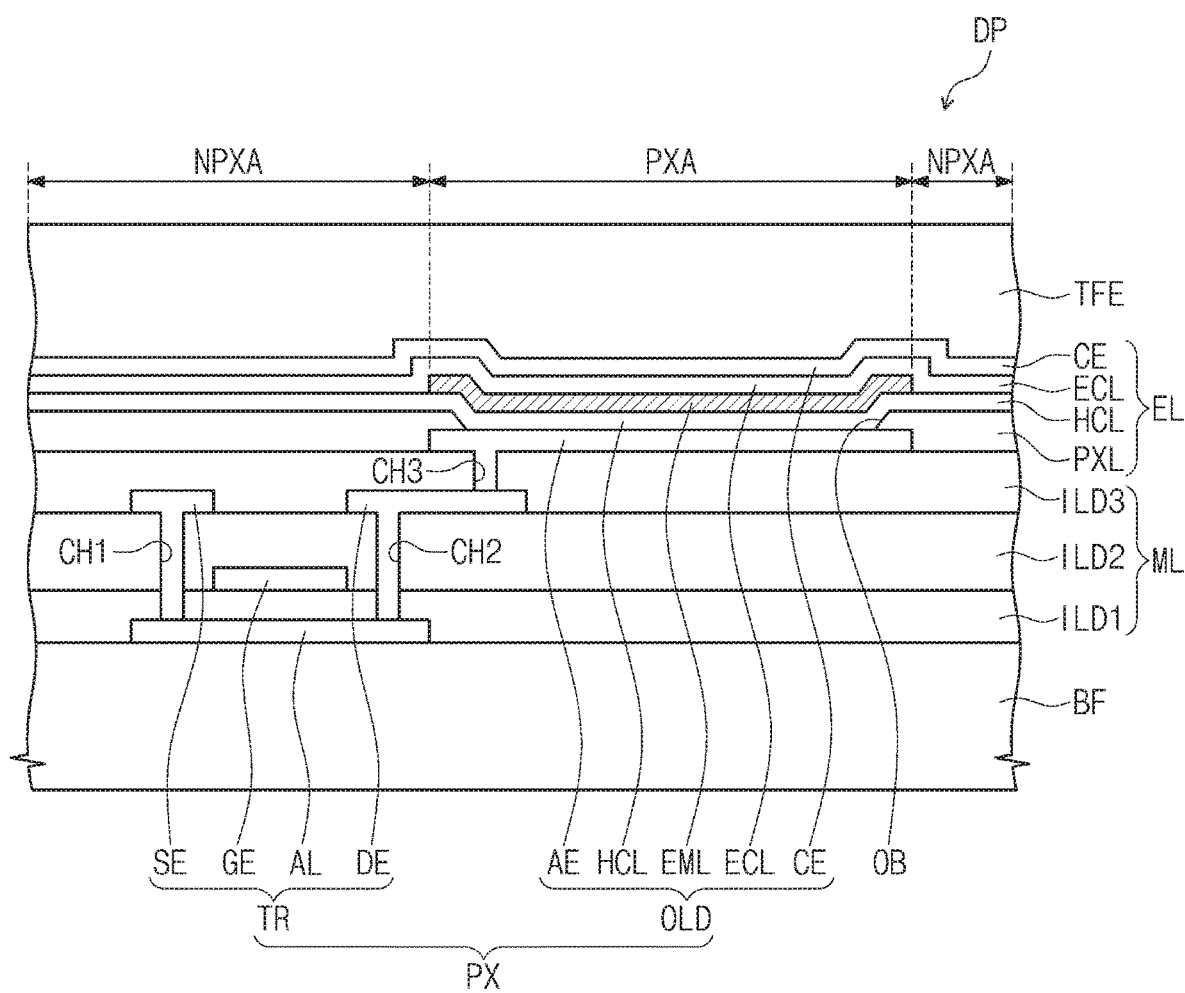
FIG. 3 is a cross-sectional view illustrating a pixel according to an embodiment of the inventive concept.
Figure 4:
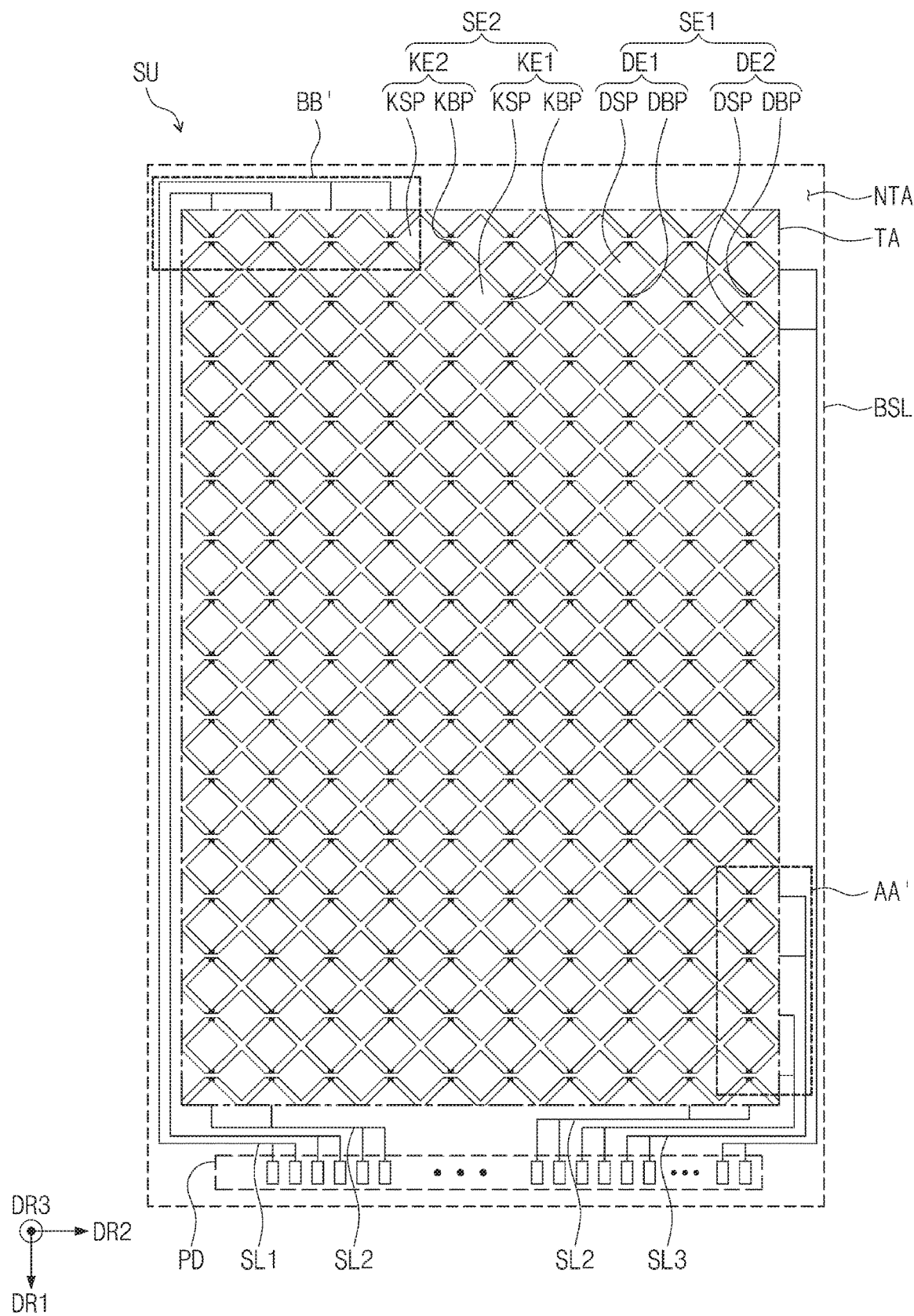
FIG. 4 is a plan view illustrating an input sensing unit according to an embodiment of the inventive concept.

FIG. 1 is a perspective view illustrating an electronic device according to an embodiment of the inventive concept. FIGS. 2A and 2B are cross-sectional views illustrating the electronic device according to an embodiment of the inventive concept. FIG. 3 is a cross-sectional view illustrating a pixel according to an embodiment of the inventive concept. FIG. 4 is a plan view illustrating an input sensing unit according to an embodiment of the inventive concept.

Referring to FIG. 1, an electronic device EA is activated by receiving an electric signal. The electronic device EA may be divided, on a plane defined by a first direction DR1 and a second direction DR2, into an active area AA and a non-active area NAA.

The active area AA may be electrically activated when an electric signal is provided. The active area AA may be activated to have various functions according to a purpose of the electronic device EA.

For example, the active area AA may be a sensing area for detecting an input applied from the outside. According to an embodiment, the electronic device EA may detect an external input TC applied to the active area AA. In terms of this aspect, the electronic device EA may serve as an input device.

Although a user's hand is illustrated as an example of the external input TC, the external input applied from the outside may be provided in various types. For example, the input may include contact that is generated by a portion of a human body such as user's hands and an external input that is applied by being approached to or being disposed adjacent by a predetermined distance to the electronic device EA (e.g., hovering). Also, the external input may have various types such as force, pressure, and light. However, the embodiment of the inventive concept is not limited thereto.

Also, the active area AA may be a display area for displaying predetermined information. The electronic device EA may display an image on the active area AA, and the user may acquire information through the image. In terms of this aspect, the electronic device EA may serve as an output device.

The non-active area NAA is disposed adjacent to the active area AA. Even when an electric signal is applied, the non-active area NAA does not provide a function for displaying an image to the outside or detecting an external input.

The non-active area NAA may be an area in which signal lines for providing a signal applied from the outside to the active area AA or driving elements for driving the active area AA are disposed.

In one embodiment, although the non-active area NAA has a frame shape surrounding the active area AA, the present inventive concept is not limited thereto. For example, the non-active area NAA may be omitted. The non-active area NAA may have various shapes according to the shape of the active area AA. However, the present inventive concept is not limited thereto.

FIG. 1 is a view illustrating a touch screen as an example of the electronic device EA. However, the present inventive concept is not limited thereto. For example, a display function of the electronic device EA may be omitted.

Referring to FIGS. 2A and 3, the electronic device EA includes a display panel DP and an input sensing unit SU. The display panel DP includes a base layer BF, a circuit layer ML, a light emitting element layer EL, and a thin-film encapsulation layer TFE. The display panel DP may include a display area for displaying an image and a non-display area disposed adjacent to the display area. The display area may overlap the active area AA, and the non-active area may overlap the non-active area NAA.

The base layer BF may be a basal layer on which other components of the display panel DP are disposed. The base layer BF may include a plastic substrate, a glass substrate, or an organic/inorganic composite substrate. Also, the base layer BF may be a laminated structure including a plurality of insulation layers.

The circuit layer ML is disposed on the base layer BF. The circuit layer ML includes a thin-film transistor TR and a plurality of insulation layers ILD1, ILD2, and ILD3. The circuit layer ML may include a thin-film transistor TR and a capacitor (not shown), which are electrically connected to a light emitting element layer EL. The circuit layer ML may be electrically connected to the light emitting element layer EL to control light emission of the light emitting element layer EL.

The light emitting element layer EL is disposed on the circuit layer ML. The light emitting element layer EL includes an organic light emitting element OLD and a pixel defining layer PXL. The light emitting element layer EL realizes an image by displaying light according to an electric signal transmitted through the thin-film transistor TR and the capacitor of the circuit layer ML. Various embodiments may include of the present inventive concept may include the light emitting element layer EL. For example, the light emitting element layer EL may include an electrophoretic element, a liquid crystal capacitor, an electrowetting element, or an organic light emitting element. For convenience of description, the light emitting element layer EL is described below as an embodiment including an organic light emitting element.

A pixel PX for displaying an image is disposed on the base layer BF. The pixel PX includes the thin-film transistor TR and the organic light emitting element OLD. The thin-film transistor TR may be contained in the circuit layer ML. The organic light emitting element OLD may be contained in the organic light emitting element layer EL.

The active area AA (refer to FIG. 1) according to an embodiment of the inventive concept may include a light emitting area PXA and a non-light emitting area NPXA disposed adjacent to the light emitting area PXA. The non-light emitting area NPXA may surround the light emitting area PXA on a plane. The light emitting area PXA may be provided in plurality in the active area AA. The plurality of light emitting areas may be spaced apart from each other, and the non-light emitting area NPXA may be disposed adjacent to the light emitting areas. FIG. 3 exemplarily illustrates one light emitting area PXA.

The thin film transistor TR includes a semiconductor pattern AL, a control electrode GE, an input electrode SE, and an output electrode DE.

The semiconductor pattern AL of the thin-film transistor TR and the first insulation layer ILD1 are disposed on the base layer BF. The first insulation layer ILD1 covers the semiconductor pattern AL.

The control electrode GE and the second insulation layer ILD2 are disposed on the first insulation layer ILD1. The second insulation layer ILD2 covers the control electrode GE. Each of the first insulation layer ILD1 and the second insulation layer ILD2 includes an organic layer and/or an inorganic layer. Each of the first insulation layer ILD1 and the second insulation layer ILD2 may include a plurality of thin-films.

The input electrode SE, the output electrode DE, and the third insulation layer ILD3 are disposed on the second insulation layer ILD2. The third insulation layer ILD3 covers the input electrode SE and the output electrode DE.

The input electrode SE and the output electrode DE are connected to the semiconductor pattern AL through a first through-hole CH1 and a second through-hole CH2, which are defined in the first insulation layer ILD1 and the second insulation layer ILD2, respectively.

The organic light emitting element OLD and the pixel defining layer PXL are disposed on the third insulation layer ILD3. The organic light emitting element OLD includes an anode electrode AE, a light emitting pattern EML, a cathode electrode CE, a hole transporting region HCL defined between the anode electrode AE and the light emitting pattern EML, and an electron transporting region ECL defined between the cathode electrode AE and the light emitting pattern EML.

The anode electrode AE is connected to the output electrode DE through a third through-hole CH3 defined in the third insulation layer ILD3.

The pixel defining layer PXL is disposed on the third insulation layer ILD3. An opening OB for exposing at least a portion of the anode electrode AE may be defined in the pixel defining layer PXL. An area on which the anode electrode AE is disposed may correspond to the light emitting area PXA of light emitted from the organic light emitting element OLD. In another embodiment of the inventive concept, an area in which the opening OB is defined may correspond to the light emitting area PXA.

The hole transporting region HCL is disposed on the anode electrode AE to cover the anode electrode AE and the pixel defining layer PXL. The hole transporting region HCL may include at least one of a hole injection layer, a hole transporting layer, and a single layer having both a hole injection function and a hole transporting function.

The light emitting pattern EML is disposed on the hole transporting region HCL. The light emitting pattern EML may include a fluorescent material, a phosphorus material, and a quantum dot. The light emitting pattern EML may generate light having one color or light having a mixed color of at least two colors. The light emitting area PXA according to an embodiment of the inventive concept may overlap the light emitting pattern EML on the plane.

The electron transporting region ECL is disposed on the light emitting pattern EML to cover the light emitting pattern EML and the hole transporting region HCL. The electron transporting region ECL may include at least one of an electron transporting material and an electron injection material. The electron transporting region ECL may be an electron transporting layer including the electron transporting material or an electron injection/transporting single layer including the electron transporting material and the electron injection material.

The cathode electrode CE is disposed on the electron transporting region ECL to face the anode electrode AE. The cathode electrode CE may be made of a material having a low work function to easily inject an electron.

The cathode electrode CE and the anode electrode AE may be made of different materials from each other according to a light emitting method. For example, when the display panel layer DP according to an embodiment of the inventive concept is a front light emitting type, the cathode electrode CE may be a transmissive-type electrode, and the anode electrode AE may be a reflective-type electrode. Alternatively, for example, when the display panel layer DP according to an embodiment of the inventive concept is a rear light emitting type, the cathode electrode CE may be a reflective-type electrode, and the anode electrode AE may be a transmissive-type electrode. The display panel DP according to an embodiment of the inventive concept may include the organic light emitting element having various structures. However, the embodiment of the inventive concept is not limited thereto. The display panel DP according to an embodiment of the inventive concept may include the organic light emitting element having various structures. However, the embodiment of the inventive concept is not limited thereto.

The thin-film encapsulation layer TFE is disposed on the cathode electrode CE. The thin-film encapsulation layer TFE covers an entire surface of the cathode electrode CE to seal the organic light emitting element OLD. The thin-film encapsulation layer TFE protects the organic light emitting element OLD against moisture and foreign substances. The thin-film encapsulation layer TFE may be formed through deposition.

The thin-film encapsulation layer TFE includes an inorganic layer and/or an organic layer. The inorganic layer may include at least one of, e.g., an aluminum oxide, a silicon oxide, a silicon nitride, a silicon oxynitride, a silicon carbide, a titanium oxide, a zirconium oxide, and a zinc oxide.

The organic layer may include at least one of, e.g., epoxy, polyimide (PI), polyethylene terephthalate (PET), polycarbonate (PC), polyethylene (PE), and polyacrylate. The inorganic layer according to an embodiment may be provided in plurality, and the inorganic layers may be disposed with the organic layer therebetween to cover the organic layer.

The input sensing unit SU according to an embodiment of the inventive concept may be directly formed on the thin-film encapsulation layer TFE. Accordingly, the input sensing unit SU may be formed on the thin-film encapsulation layer TFE through a continuous process. However, the present inventive concept is not limited thereto. For example, an adhesion member (not shown) may be provided between the thin-film encapsulation layer TFE and the input sensing unit SU, and the thin-film encapsulation layer TFE and the input sensing unit SU may be coupled to each other by the adhesion member. The adhesion member may be an organic adhesion layer such as an optically clear adhesive film (OCA), an optically clear resin (OCR), or a pressure sensitive adhesive film (PSA). However, the present inventive concept is not limited thereto.

Referring to FIG. 2B, an electronic device EA-A according to an embodiment includes a display panel DP-A and an input sensing unit SU-A. The display panel DP-A includes a base layer BF-A, a circuit layer ML-A, a light emitting element layer EL-A, a sealing part LP, and an encapsulation substrate EPL. Overlapping description for the same component as that of the electronic device EA in FIG. 2A will be omitted.

The encapsulation substrate EPL according to an embodiment seals the light emitting element layer EL-A. The encapsulation substrate EPL protects the light emitting element layer EL-A from foreign substances such as moisture, oxygen, and dust particles. The encapsulation substrate EPL may be coupled to the base layer BF-A through the sealing part LP. The encapsulation substrate EPL according to an embodiment may be a substrate made of glass or plastic. The sealing part LP may contain frit. However, the present inventive concept is not limited to the material forming the sealing part LP.

Although the input sensing unit SU-A is directly formed on the encapsulation substrate EPL in FIG. 2B, the embodiment of the inventive concept is not limited thereto. For example, the input sensing unit SU-A may be separately provided and disposed on the encapsulation substrate EPL. In this case, an adhesive member (not shown) may be provided between the encapsulation substrate EPL and the input sensing unit SU-A, and the encapsulation substrate EPL and the input sensing unit SU-A may be coupled to each other by the adhesion member.

Referring to FIG. 4, the input sensing unit SU includes a sensing area TA and a peripheral area NTA. The sensing area TA may overlap the active area AA, and the peripheral area NTA may overlap the non-active area NAA. The sensing area TA may detect an external input TC. The peripheral area NTA may surround the sensing area TA. The peripheral area NTA may have the same shape as the non-active area NAA.

Although each of the sensing area TA and the peripheral area NTA has the same planar shape as each of the active area AA and the non-active area NAA in FIG. 4, the present inventive concept is not limited thereto. For example, each of the sensing area TA and the peripheral area NTA may have a different shape from the active area AA.

The input sensing unit SU includes a first electrode SE1, a second electrode SE2, trace lines SL1, SL2, and SL3, and pads PD. The first electrode SE1 and the second electrode SE2 are disposed on the sensing area TA. The trace lines SL1, SL2, and SL3 are disposed on the peripheral area NTA.

The input sensing unit SU according to an embodiment of the inventive concept may be disposed on the base member BSL. The base member BSL may correspond to the thin-film encapsulation layer TFE in FIG. 2A or the encapsulation substrate EPL in FIG. 2B. However, the present inventive concept is not limited thereto. For example, the base member BSL may be different from each of the thin-film encapsulation layer TFE and the encapsulation substrate EPL.

The first electrode SE1 includes driving electrodes each including a first pattern DSP and a first connecting pattern DBP. The second electrode SE2 includes sensing electrodes each including a second pattern KSP and a second connecting pattern KBP. Although two driving electrodes DE1 and DE2 and two sensing electrodes KE1 and KE2 are illustrated in FIG. 4 for convenience of description, in another embodiment that will be described later, the driving electrodes DE1 and DE2 and the sensing electrodes KE1 and KE2 may correspond to the driving electrodes and the sensing electrodes contained in the first electrode SE1 and the second electrode SE2.

The driving electrodes DE1 and DE2 each extends in the first direction DR1 and are arranged in the second direction DR2. Each of the first pattern DSP and the first connecting pattern DBP is provided in plurality. Each of the first patterns and each of the first connecting patterns are arranged in the first direction DR1 to define one driving electrode DE1 and DE2. The first connecting patterns are disposed between the first patterns, which are disposed adjacent thereto. The first patterns are electrically connected through the first connecting patterns.

The sensing electrodes KE1 and KE2 each extends in the second direction DR2 and are arranged in the first direction DR1. Each of the second pattern DSP and the second connecting pattern KBP is provided in plurality. Each of the second patterns and each of the second connecting patterns are arranged in the second direction DR2 to define one sensing electrode KE1 and KE2. The second connecting patterns are disposed between the second patterns, which are disposed adjacent thereto. The second patterns are electrically connected through the second connecting patterns.

The first trace line SL1 is connected to one end of the corresponding driving electrode, and the second trace line SL2 is connected to the other end of the corresponding driving electrode. The third trace line SL3 is connected to one end of the corresponding sensing electrode.

Each of the trace lines SL1, SL2, and SL3 passes through the peripheral area NTA and is connected to a corresponding pad of the pads PD Each of the first trace line SL1 and the second trace line SL2 may be connected to one pad corresponding to the driving electrode DE1 and DE2. Each of the first trace line SL1 and the second trace line SL2 may transmit an electric signal, which is provided through the corresponding pad of the pads PD, to the driving electrode DE1 and DE2 or transmit an electric signal, which is provided from the driving electrode DE1 and DE2, to the outside through the corresponding pad. The third trace line SL3 may connect one pad corresponding to the sensing electrode KE1 and KE2. The third trace line SL3 may transmit an electric signal, which is provided through the corresponding pad of the pads PD, to the sensing electrode KE1 and KE2 or transmit an electric signal, which is provided from the sensing electrode KE1 and KE2, to the outside through the corresponding pad.

Figure 5:
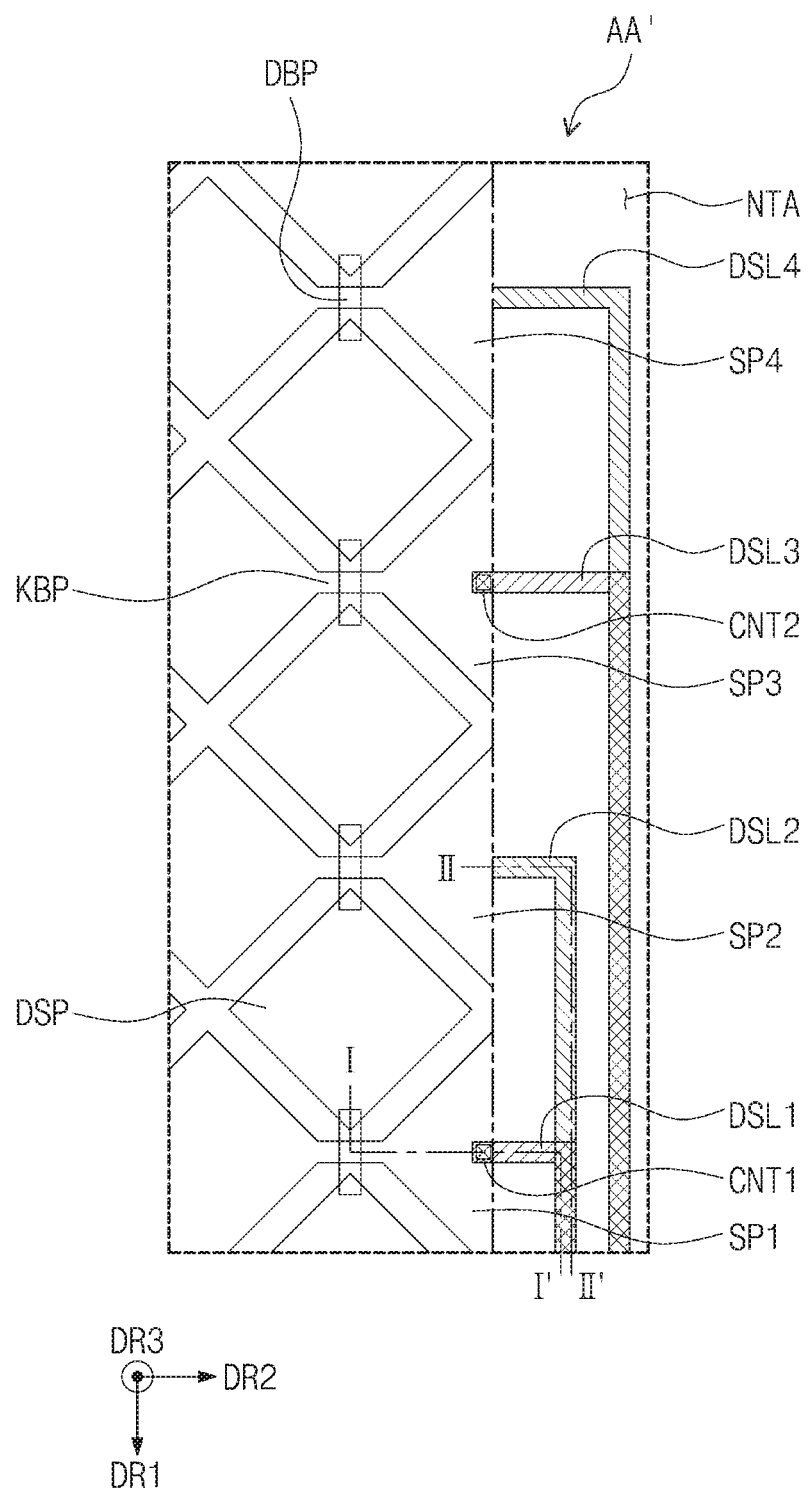
FIG. 5 is an enlarged view illustrating region AA' of FIG. 4.
Figure 6A:
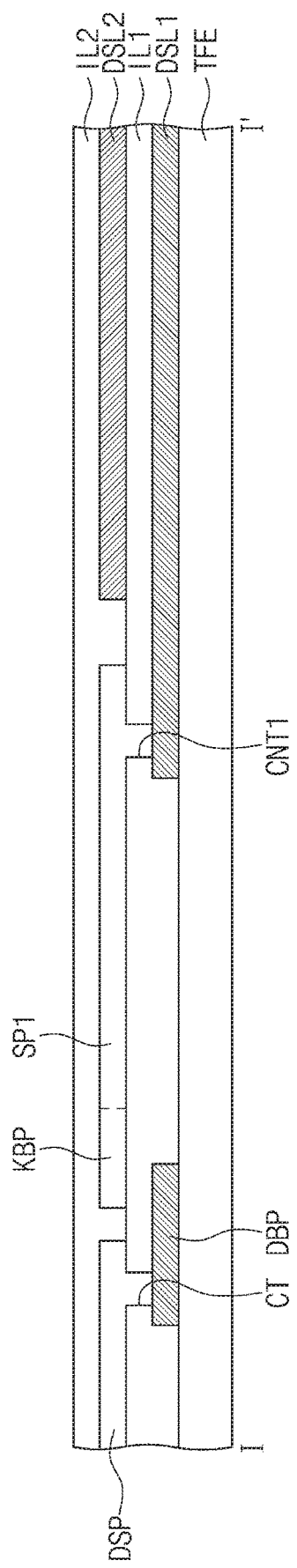
FIG. 6A is a cross-sectional view taken along line I-I' of FIG. 5.
Figure 6B:
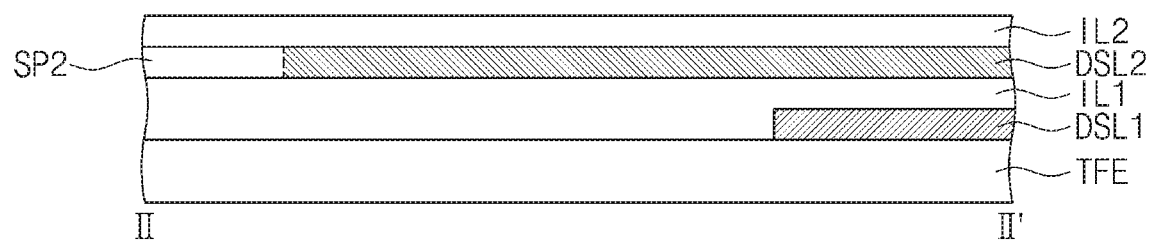
FIG. 6B is a cross-sectional view taken along line II-II' of FIG. 5.
Figure 6C:
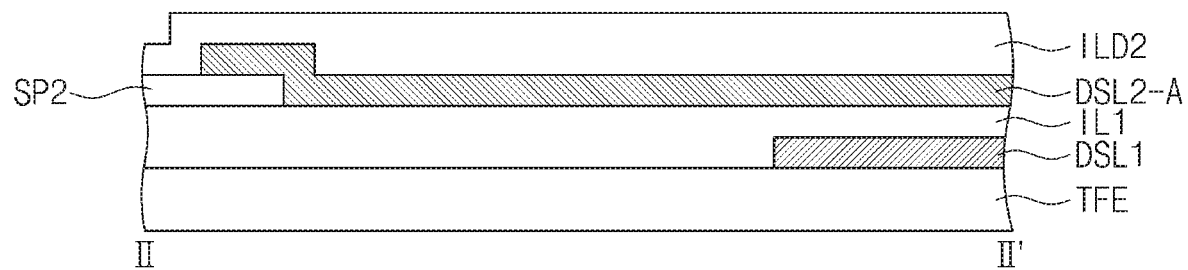
FIG. 6C is a cross-sectional view illustrating the input sensing unit according to an embodiment of the inventive concept.

FIG. 5 is an enlarged view illustrating region AA of FIG. 4. FIG. 6A is a cross-sectional view taken along line I-I' of FIG. 5. FIG. 6B is a cross-sectional view taken along line II-II' of FIG. 5. FIG. 6C is a cross-sectional view illustrating an input sensing unit according to an embodiment of the inventive concept. The same components as those in FIGS. 1 to 4 will be designated by the same reference numerals, and overlapping descriptions will be omitted. In FIG. 5, for convenience of description, some of electrodes disposed on one end of each of the sensing electrodes in FIG. 4 are indicated by first to fourth sensing patterns SP1, SP2, SP3, and SP4. Also, trace lines of the trace lines SL1, SL2, and SL3 in FIG. 4, which are connected to the first to fourth sensing patterns SP1, SP2, SP3, and SP4, are indicated by first to fourth sensing trace lines DSL1, DSL2, DSL3, and DSL4.

According to an embodiment of the inventive concept, the first to fourth sensing patterns SP1, SP2, SP3, and SP4 are connected to the corresponding first to fourth sensing trace lines DSL1, DSL2, DSL3, and DSL4, respectively. The sensing trace lines DSL1, DSL2, DSL3, and DSL4 are disposed on the peripheral area NTA. The peripheral area NTA according to an embodiment of the inventive concept may overlap the non-active area NAA (refer to FIG. 1).

The non-active area NAA may be an area overlapping the non-display area of the display panel DP (refer to FIG. 2B) and an area on which the driving elements and lines of each of the display panel DP and the input sensing unit SU. Accordingly, as the non-active area NAA of the electronic device EA decreases, a narrow bezel may be realized. Thus, the non-display area of the display panel DP and the peripheral area NTA of the input sensing unit SU are required to be reduced.

According to an embodiment of the inventive concept, the corresponding sensing trace lines DSL1, DSL2, DSL3, and DSL4 of the sensing trace lines DSL1, DSL2, DSL3, and DSL4 may overlap each other on the plane. For example, the first sensing pattern SP1 and the second sensing pattern SP2, which are spaced apart from each other in the first direction DR1, are connected to the first sensing line DSL1 and the second sensing line DSL2, respectively. The first sensing line DSL1 and the second sensing line DSL2 at least partially overlap each other on the plane.

The third sensing pattern SP3 and the fourth sensing pattern SP4, which are spaced apart from the first sensing pattern SP1 and the second sensing pattern SP2 and spaced apart from each other in the first direction DR1, are connected to the third sensing line DSL3 and the fourth sensing line DSL4, respectively. The third sensing line DSL3 and the fourth sensing line DSL4 at least partially overlap each other on the plane. Each of the third sensing line DSL3 and the fourth sensing line DSL4 is spaced apart from each of the first sensing line DSL1 and the second sensing line DSL2.

Referring to FIG. 6A, the first sensing line DSL1 and the first connecting pattern DBP are disposed on the thin-film encapsulation layer TFE. The first sensing line DSL1 and the first connecting pattern DBP are spaced apart from each other by a first insulation layer IL1 and electrically insulated with each other by the first insulation layer IL1.

The first insulation layer IL1 is disposed on the first sensing line DSL1 and the first connecting pattern DBP. The first insulation layer IL1 includes a sensing contact hole CT and a first contact hole CNT1, each of which passes through the first insulation layer IL1.

The first pattern DSP is disposed on the first insulation layer IL1. The first pattern DSP is connected to the first connecting pattern DBP through the sensing contact hole CT.

The second connecting pattern KBP and the first sensing pattern SP1 are disposed on the first insulation layer IL1. Each of the second connecting pattern KBP and the first sensing pattern SP1 is electrically insulated from the first pattern DSP by a second insulation layer IL2. The second connecting pattern KBP and the first sensing pattern SP1 may be disposed on the same layer and connected to each other. The second connecting pattern KBP and the first sensing pattern SP1 may substantially have an integrated shape. That is, the second connecting pattern KBP and the first sensing pattern SP1 may be formed continuously and unitarily as a single piece and made of the same material or materials. In FIG. 6A, for convenience of description, a boundary between the second connecting pattern KBP and the first sensing pattern SP1 is expressed as a dotted line. The second connecting pattern KBP and the first sensing pattern SP1 may be formed through a process using one mask in a manufacturing process. The first sensing pattern SP1 is connected to the first sensing line DSL1 through the first contact hole CNT1. Accordingly, the second connecting pattern KBP, the first sensing pattern SP1, and the first sensing line DSL1 are electrically connected to each other.

The second sensing line DSL2 is disposed on the first insulation layer IL1. The second sensing line DSL2 is electrically insulated from the first sensing pattern SP1 by the second insulation layer IL2.

The second insulation layer IL2 is disposed on the first pattern DSP, the second connecting pattern KBP, the first sensing pattern SP1, and the first sensing line DSL1. The second insulation layer IL2 may be disposed on the first pattern DSP, the second connecting pattern KBP, the first sensing pattern SP1, and the first sensing line DSL1 to provide an upper flat surface of the input sensing unit SU (refer to FIG. 4). The first to fourth sensing patterns SP1, SP2, SP3, and SP4 according to an embodiment of the inventive concept may be disposed on the same layer.

The insulation layers IL1 and IL2 according to an embodiment of the inventive concept may include material insulating components disposed with the insulation layers therebetween. However, the present inventive concept is not limited thereto.

Although the first connecting pattern DBP is disposed on the thin-film encapsulation layer TFE in FIG. 6A, the present inventive concept is not limited thereto. For example, the sensing patterns may be disposed on the thin-film encapsulation layer TFE, and the connecting patterns may be disposed on the insulation layer with the insulation layer therebetween. Also, although the basal layer on which the lines and the electrodes are disposed may include the thin-film encapsulation layer TFE, the present inventive concept is not limited thereto. For example, the above-described encapsulation substrate EPL in FIG. 2B may be applied as the basal layer.

Referring to FIG. 6B, the first sensing line DSL1 is disposed on the thin-film encapsulation layer TFE. The first insulation layer IL1 is disposed on the first sensing line DSL1.

The second sensing pattern SP2 and the second sensing line DSL2 are disposed on the first insulation layer IL1. The second sensing pattern SP2 and the second sensing line DSL2 may be disposed on the same layer and connected to each other. The second sensing pattern SP2 and the second sensing line DSL2 may substantially have an integrated shape. In FIG. 6B, for convenience of description, a boundary between the second sensing pattern SP2 and the second sensing line DSL2 is expressed as a dotted line. The second insulation layer IL2 is disposed on the second sensing pattern SP2 and the second sensing line DSL2.

According to an embodiment of the inventive concept, the sensing trace lines DSL1 and DSL2 connected to the adjacent sensing patterns SP1 and SP2 may overlap each other on the plane. Although the first sensing line DSL1 and the second sensing line DSL2 connected to the first sensing pattern SP1 and the second sensing pattern SP2 are described in FIGS. 6A and 6B, the third sensing line DSL3 and the fourth sensing line DSL4 connected to the third sensing pattern SP3 and the fourth sensing pattern SP4, respectively, and spaced apart from the first sensing pattern SP1 and the second sensing pattern SP2 in the first direction DR1 may be applied thereto. Accordingly, the third sensing line DSL3 and the fourth sensing line DSL4 may partially overlap each other on the plane.

According to an embodiment of the inventive concept, as the trace lines connected to the adjacent sensing patterns, e.g., a portion of the first sensing line DSL1 and the second sensing line DSL2 overlap on the plane, and the third sensing line DSL3 and the fourth sensing line DSL4 partially overlap each other on the plane, a space of the peripheral area NTA, in which the sensing trace lines DSL1, DSL2, DSL3, and DSL4, may be reduced. Accordingly, the electronic device according to an embodiment of the inventive concept may realize the narrow bezel.

Referring to FIG. 6C, unlike the second sensing line DSL2 in FIG. 6B, a second sensing line DSL2-A according to an embodiment may cover a portion of the second sensing pattern SP2. Accordingly, the second sensing line DSL2-A and the second sensing pattern SP2 may have a separated shape. The second sensing pattern SP2 and the second sensing line DSL2-A may be formed through different masks from each other during the manufacturing process.

Figure 7:
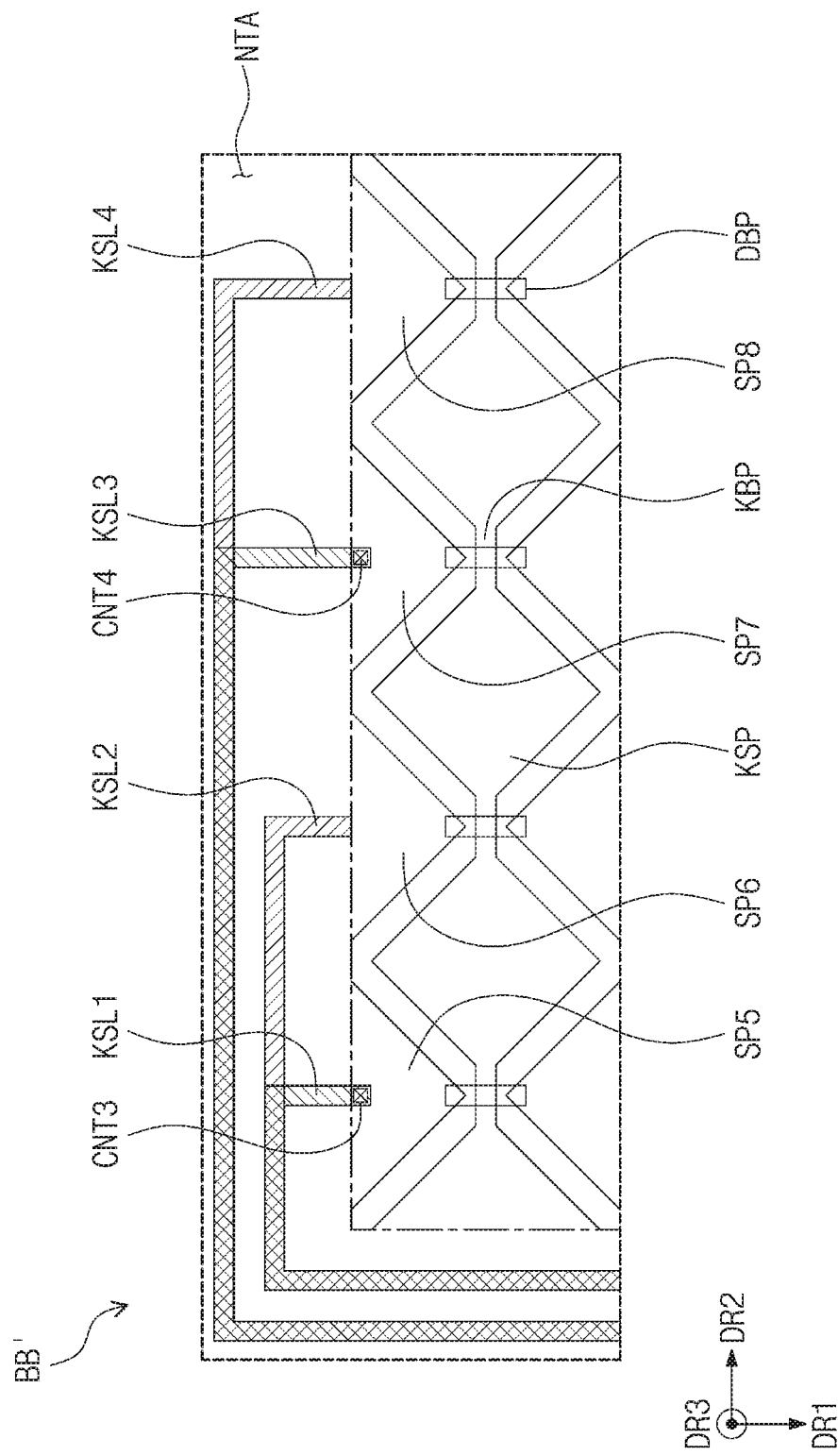
FIG. 7 is an enlarged view illustrating region BB' of FIG. 4.

FIG. 7 is an enlarged view illustrating region BB' of FIG. 4. The same components as those in FIGS. 1 to 4 will be designated by the same reference numerals, and overlapping descriptions will be omitted. In FIG. 7, for convenience of description, some of electrodes disposed on one end of each of the driving electrodes in FIG. 4 are indicated by first to fourth driving patterns SP5, SP6, SP7, and SP8. Also, trace lines of the trace lines SL1, SL2, and SL3 in FIG. 4, which are connected to the fifth to eighth driving patterns SP5, SP6, SP7, and SP8, are indicated by first to fourth driving trace lines KSL1, KSL2, KSL3, and KSL4.

According to an embodiment of the inventive concept, the first to fourth driving patterns SP5, SP6, SP7, and SP8 are connected to the corresponding first to fourth driving trace lines KSL1, KSL2, KSL3, and KSL4, respectively. The driving trace lines KSL1, KSL2, KSL3, and KSL4 are disposed on the peripheral area NTA.

According to an embodiment of the inventive concept, the corresponding driving trace lines KSL1, KSL2, KSL3, and KSL4 of the driving trace lines KSL1, KSL2, KSL3, and KSL4 may overlap each other on the plane. For example, the first driving pattern SP5 and the second driving pattern SP6, which are spaced apart from each other in the second direction DR2, are connected to the first driving line KSL1 and the second driving line KSL2, respectively. The first driving line KSL1 and the second driving line KSL2 partially overlap each other on the plane.

The first driving pattern SP5 and the second driving pattern SP6, which are spaced apart from the third driving pattern SP7 and the second driving pattern SP8 and spaced apart from each other in the second direction DR2, are connected to the third driving line KSL3 and the fourth driving line KSL4, respectively The third driving line KSL3 and the fourth driving line KSL4 at least partially overlap each other on the plane. Each of the third driving line KLS3 and the fourth driving line KSL4 is spaced apart from each of the first driving line KLS1 and the second driving line KSL2.

According to an embodiment, each of the first driving pattern SP5 and the third driving pattern SP7 is disposed on a layer different from that of each of the first driving line KSL1 and the third driving line KSL3. Accordingly, the first driving pattern SP5 is connected to the first driving line KSL1 through a fifth contact hole CNT3, and the third driving pattern SP7 is connected to the third driving line KSL3 through a fourth contact hole CNT4. The second driving pattern SP6 and the fourth driving pattern SP8 may be disposed on the same layer as the second driving line KSL2 and the fourth driving line KSL4, respectively, to have an integrated shape.

According to an embodiment of the inventive concept, the corresponding trace lines KSL1, KSL2, KSL3, and KSL4 of the trace lines KSL1, KSL2, KSL3, and KSL4, which are connected to the driving electrodes, may overlap each other on the plane to reduce the space of the peripheral area NTA on which the trace lines KSL1, KSL2, KSL3, and KSL4 are disposed. Accordingly, the electronic device according to an embodiment of the inventive concept may realize the narrow bezel.

Figure 8:
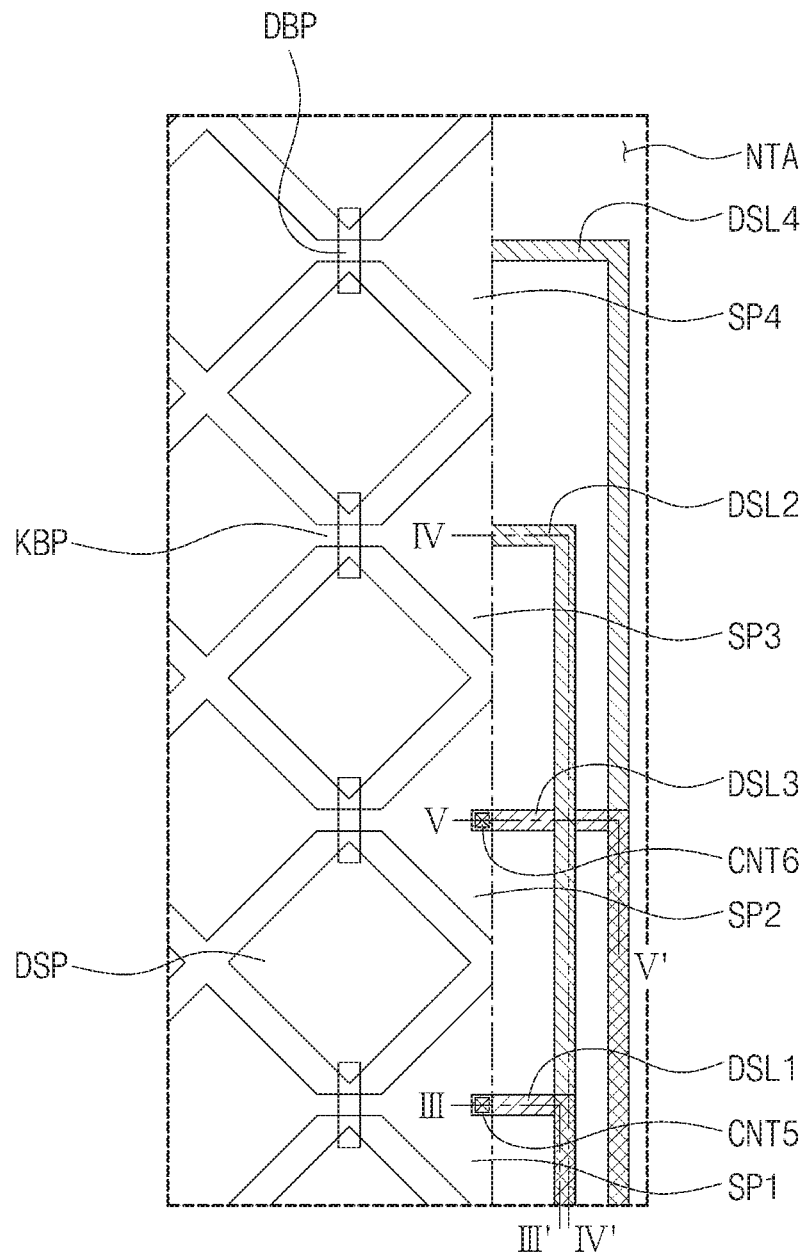
FIG. 8 is a plan view illustrating one area of the input sensing unit according to an embodiment of the inventive concept.
Figure 9A:
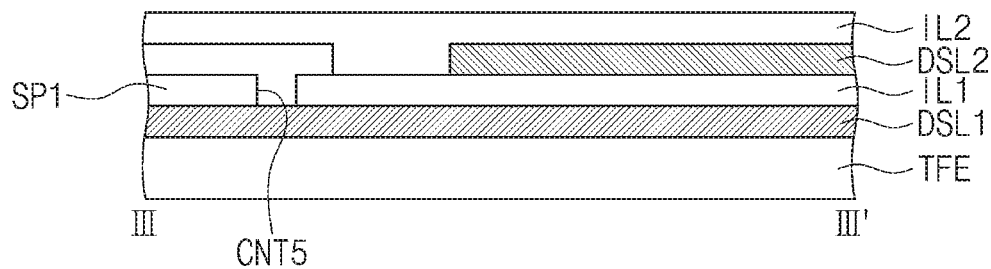
FIG. 9A is a cross-sectional view taken along line III-III' of FIG. 8.
Figure 9B:
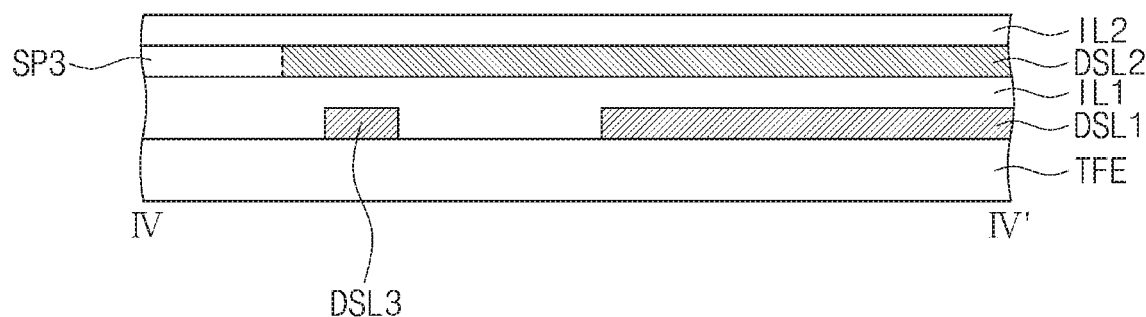
FIG. 9B is a cross-sectional view taken along line IV-IV' of FIG. 8.

FIG. 8 is a plan view illustrating one area of the input sensing unit according to an embodiment of the inventive concept. FIG. 9A is a cross-sectional view taken along line III-III' of FIG. 8. FIG. 9B is a cross-sectional view taken along line IV-IV' of FIG. 8. FIG. 9 is a cross-sectional view taken along line V-V' of FIG. 8. The same components as those in FIGS. 5 to 6B will be designated by the same reference numerals, and overlapping descriptions will be omitted.

Referring to FIG. 8, the sensing lines DSL1, DSL2, DSL3, and DSL4 according to an embodiment may at least partially cross each other on the plane. For example, the first sensing line DSL1 and the second sensing line DSL2 are connected to the first sensing pattern SP1 and the third sensing pattern SP3, respectively. The first sensing line DSL1 and the second sensing line DSL2 at least partially overlap each other on the plane.

The third sensing line DSL3 is connected to the second sensing pattern SP2. The second sensing pattern SP2 is disposed between the first sensing pattern SP1 and the third sensing pattern SP3 in the first direction DR1. According to an embodiment, the third sensing line DSL3 connected to the second sensing pattern SP2 may be relatively further spaced from the sensing area TA than the first sensing line DSL1 and the second sensing line DSL2. The third sensing line DSL3 passes through the peripheral area NTA and is connected to the second sensing pattern SP2. Accordingly, a portion of the third sensing line DSL3 connected to the second sensing pattern SP2 may overlap a portion of the second sensing line DSL2 on the plane.

Referring to FIG. 9A, the first sensing line DSL1 is disposed on the thin-film encapsulation layer TFE. The first insulation layer IL1 is disposed on the first sensing line DSL1. The first insulation layer IL1 includes a fifth contact hole CNT5 passing therethrough.

The first sensing pattern SP1 and the second sensing line DSL2 are disposed on the first insulation layer IL1. The first sensing pattern DP1 and the second sensing line DSL2 are spaced apart from each other by the first insulation layer IL1 and electrically insulated with each other by the first insulation layer IL1. The first sensing pattern SP1 is connected to the first sensing line DSL1 through the fifth contact hole CNT5. The second insulation layer IL2 is disposed on the first sensing pattern SP1 and the second sensing line DSL2.

Referring to FIG. 9B, the first sensing line DSL1 and the third sensing line DSL3 are disposed on the thin-film encapsulation layer TFE. The first sensing line DSL1 and the third sensing line DSL3 are spaced apart from each other by the first insulation layer IL1 and electrically insulated with each other by the first insulation layer IL1.

The third sensing pattern SP3 and the second sensing line DSL2 are disposed on the first insulation layer IL1. The third sensing pattern SP3 and the second sensing line DSL2 may be disposed on the same layer and connected to each other. The third sensing pattern SP3 and the second sensing line DSL2 may substantially have an integrated shape. In FIG. 9B, for convenience of description, a boundary between the third sensing pattern SP3 and the second sensing line DSL2 is expressed as a dotted line. The second insulation layer IL2 is disposed on the third sensing pattern SP3 and the second sensing line DSL2. According to an embodiment, the first sensing line DSL1 and the second sensing line DSL2, which are connected to the first sensing pattern SP1 and the third sensing pattern SP3, which are spaced apart from each other, respectively, at least partially overlap each other.

Figure 9C:
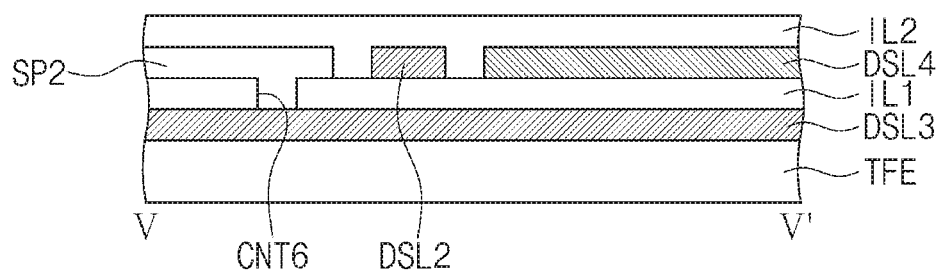
FIG. 9C is a cross-sectional view taken along line V-V' of FIG. 8.

Referring to FIG. 9C, the third sensing line DSL3 is disposed on the thin-film encapsulation layer TFE. The third sensing line DSL3 is disposed on the first insulation layer IL1. The first insulation layer IL1 includes a sixth contact hole CNT6 passing therethrough. The third sensing line DSL3 is connected to the second sensing pattern SP2 disposed between the first sensing pattern SP1 and the third sensing pattern SP3, which are spaced apart from each other in the first direction DR1.

The second sensing pattern SP2, the second sensing line DSL2, and the fourth sensing line DSL4 are disposed on the first insulation layer IL1. The second sensing pattern SP2, the second sensing line DSL2, and the fourth sensing line DSL4 are spaced apart from each other by the first insulation layer IL1 and electrically insulated with each other by the first insulation layer IL1.

The second sensing pattern SP2 is connected to the third sensing line DSL3 through the sixth contact hole CNT6. The second insulation layer IL2 is disposed on the second sensing pattern SP2, the second sensing line DSL2, and the fourth sensing line DSL4.

According to an embodiment, at least a portion of the third sensing line DSL3 connected to the second sensing pattern SP2 disposed between the sensing patterns SP1 and SP3, which are spaced apart from each other, may overlap a portion of the second sensing line DSL2.

Figure 10:
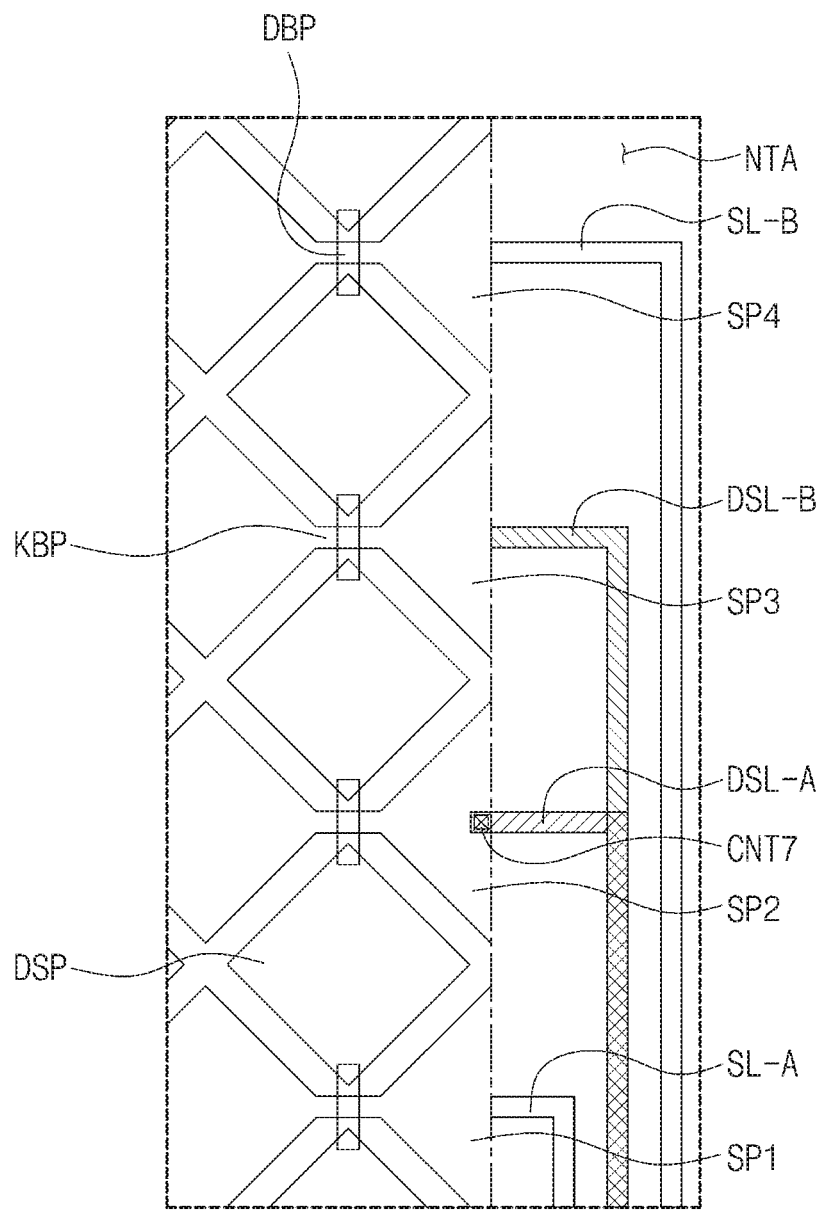
FIG. 10 is a plan view illustrating one area of the input sensing unit according to an embodiment of the inventive concept.

FIG. 10 is a plan view illustrating one area of the input sensing unit according to an embodiment of the inventive concept. The same components as those in FIGS. 5 to 6B will be designated by the same reference numerals, and overlapping descriptions will be omitted.

Referring to FIG. 10, unlike FIG. 5, sensing lines DSL-A and DSL-B, which overlap each other on the plane, may be disposed between single lines SL-A and SL-B. That is, at least a portion of the lines disposed in the peripheral area NTA may include only single lines that non-overlap each other on the plane, and the sensing lines DSL-A and DSL-B, which overlap each other on the plane, may be spaced apart from the single lines SL-A and SL-B.

For example, the first sensing line DSL-A of the sensing lines DSL-A and DSL-B may be disposed on a different layer from the second sensing pattern SP2 and connected to the second sensing pattern SP2 through a contact hole CNT7. The second sensing line DSL-B may be disposed on the same layer as the third sensing pattern SP3 and directly connected to the third sensing pattern SP3.

The single lines SL-A and SL-B may be connected to the sensing patterns SP1 and SP3 through a contact hole or disposed on the same layer and directly connected to each other. However, the embodiment of the inventive concept is not limited thereto.

According to the embodiment of the inventive concept, as the trace lines of the trace lines disposed on the peripheral area, which are connected to the electrodes different from each other, overlap on the plane, the space of the peripheral area may be reduced. Accordingly, the electronic device according to the embodiment of the inventive concept may realize the narrow bezel.

The above-disclosed subject matter is to be considered illustrative and not restrictive.

What is claimed is:

1. An electronic device comprising:
   a display panel comprising a base layer, pixels disposed on the base layer, and an encapsulation layer covering the pixels, the display panel being divided into a display area on which the pixels are disposed and a non-display area disposed adjacent to the display area on a plane; and
   an input sensing unit comprising:
   a first insulation layer disposed directly on the encapsulation layer;
   a second insulation layer disposed directly on the first insulation layer;
   first electrodes extending in a first direction, each of the first electrodes including first patterns arranged along the first direction, and first connecting patterns connecting the first patterns and disposed on a different layer from the first patterns;
   second electrodes extending in a second direction crossing the first direction, each of the second electrodes including second patterns arranged along the second direction and spaced apart from the first patterns, and second connecting patterns disposed between the second patterns and intersecting the first connecting patterns on the plane;
   a first line connected to one of the second electrodes and overlapping the non-display area; and
   a second line connected to another one of the second electrodes and overlapping the non-display area,
   wherein the first connecting patterns and the first line are disposed under the first insulating layer, and the first patterns, the second patterns, the second connecting patterns and the second line are disposed directly on the first insulating layer and covered by the second insulating layer,
   wherein a second pattern included in the one of the second electrodes is connected to the first line through a contact hole penetrating the first insulating layer, and a second pattern included in the another one of the second electrodes is directly connected to the second line, and
   wherein portions of the first line and the second line overlap each other in the first direction.

2. The electronic device of claim 1, further comprising a third line connected to one of the first electrodes and disposed on a same layer as the first line and overlapping the non-display area, and a fourth line connected to another one of the first electrodes and disposed on a same layer as the second line and overlapping the non-display area.

3. The electronic device of claim 2, wherein a first pattern included in the one of the first electrodes is connected to the third line through a contact hole penetrating the first insulating layer, and a first pattern included in the another one of the first electrodes is directly connected to the fourth line.

4. The electronic device of claim 3, wherein portions of the third line and the fourth line overlap each other in the second direction.

5. The electronic device of claim 1, wherein the second patterns and the second connecting patterns have an integral shape.

6. The electronic device of claim 2, wherein the first connecting patterns, the first line, and the third line have a same material.

7. The electronic device of claim 2, wherein the second electrodes, the second line, and the fourth line have a same material.

8. The electronic device of claim 1, wherein the encapsulation layer comprises an organic layer and a plurality of inorganic layers covering the organic layer.

9. The electronic device of claim 1, further comprising a sealing part disposed to overlap the non-display area,
   wherein the sealing part is disposed between the base layer and the encapsulation layer.

10. The electronic device of claim 1, wherein the second line is directly connected to a portion of an upper surface and a side surface of one of the second patterns.

11. An input sensing unit comprising:
    a base layer;
    a first insulation layer disposed on the base layer;
    a second insulation layer disposed on the first insulation layer;
    driving electrodes extending in a first direction, each of the driving electrodes including first patterns arranged along the first direction, and first connecting patterns connecting the first patterns and disposed on a different layer from the first patterns;
    sensing electrodes extending a second direction crossing the first direction, each of the sensing electrodes including second patterns arranged along the second direction and spaced apart from the first patterns, and second connecting patterns disposed between the second patterns and intersecting the first connecting patterns on the plane;
    a first line connected to one of the sensing electrodes and overlapping a non-display area; and
    a second line connected to another one of the sensing electrodes and overlapping the non-display area,
    wherein the first connecting patterns and the first line are disposed under the first insulating layer, and the first patterns, the second patterns, the second connecting patterns and the second line are disposed directly on the first insulating layer and covered by the second insulating layer,
    wherein a second pattern included in the one of the sensing electrodes is connected to the first line through a contact hole penetrating the first insulating layer, and a second pattern included in the another one of the sensing electrodes is directly connected to the second line, and wherein portions of the first line and second line overlap each other in the first direction.

12. The input sensing unit of claim 11, further comprising a third line connected to one of the driving electrodes and disposed on a same layer as the first line and overlapping the non-display area, and a fourth line connected to another one of the driving electrodes and disposed on a same layer as the second line and overlapping the non-display area.

13. The input sensing unit of claim 12, wherein a first pattern included in the one of the driving electrodes is connected to the third line through a contact hole penetrating the first insulating layer, and a first pattern included in the another one of the driving electrodes is directly connected to the fourth line.

14. The input sensing unit of claim 13, wherein portions of the third line and fourth line overlap each other in the second direction.

15. The input sensing units of claim 11, wherein the second patterns and the second connecting patterns have an integral shape.

16. The input sensing unit of claim 12, wherein the first connecting patterns, the first line, and the third line have a same material.

17. The input sensing unit of claim 12, wherein the second electrodes, the second line, and the fourth line have a same material.

18. The electronic device of claim 11, wherein the second line is directly connected to a portion of an upper surface and a side surface of the second pattern.

* * * * *